United States Patent [19]

Smith et al.

[11] Patent Number: 4,674,004
[45] Date of Patent: Jun. 16, 1987

[54] PARALLEL-FLOW AIR SYSTEM FOR COOLING ELECTRONIC EQUIPMENT

[75] Inventors: Grant M. Smith, Bryn Athyn; Samuel R. Romania, Phoenixville; Ronald T. Gibbs, King of Prussia, all of Pa.

[73] Assignee: Burroughs Corporation, Detroit, Mich.

[21] Appl. No.: 881,725

[22] Filed: Jul. 3, 1986

[51] Int. Cl.⁴ .............................................. H05K 7/20
[52] U.S. Cl. .................................... 361/384; 165/908
[58] Field of Search ............ 361/383, 384; 174/16 R; 165/908, 104.34; 62/418

[56] References Cited

U.S. PATENT DOCUMENTS

| | | | |
|---|---|---|---|
| 2,843,806 | 7/1958 | O'Neill | 174/16 R X |
| 3,198,991 | 8/1965 | Barnett | 361/384 |
| 3,817,160 | 6/1974 | Searcy et al. | 98/36 |
| 4,227,317 | 10/1980 | Fleissner | 34/155 |
| 4,277,816 | 7/1981 | Dunn et al. | 361/384 |
| 4,296,455 | 10/1981 | Leaycraft et al. | 361/383 |
| 4,417,295 | 11/1983 | Stuckert | 361/384 |
| 4,489,363 | 12/1984 | Goldberg | 361/383 |
| 4,498,118 | 2/1985 | Bell | 361/384 |

OTHER PUBLICATIONS

R. G. Biskeborn et al., "Integral Cap Heat Sink Assembly for the IBM 4381 Processor", Oct. 1984, pp. 468–474.

N. Timko, Jr., "Blower Performance Enhancements in the 4381 Computer", Oct. 1984, pp. 475–482.

Primary Examiner—William E. Tapolcai
Attorney, Agent, or Firm—Mark T. Starr

[57] ABSTRACT

The present disclosure describes an air cooling system which has the ability to maintain acceptable temperature levels in present day high density electronic equipment. More specifically, the system provides an arrangement whereby each printed circuit card has its own ducting structure affixed thereto to form an integral unit. Cooling air streams are directed simultaneously from individual apertures in the ducting structure upon a respective plurality of integrated circuit package assemblies mounted on the card.

21 Claims, 4 Drawing Figures

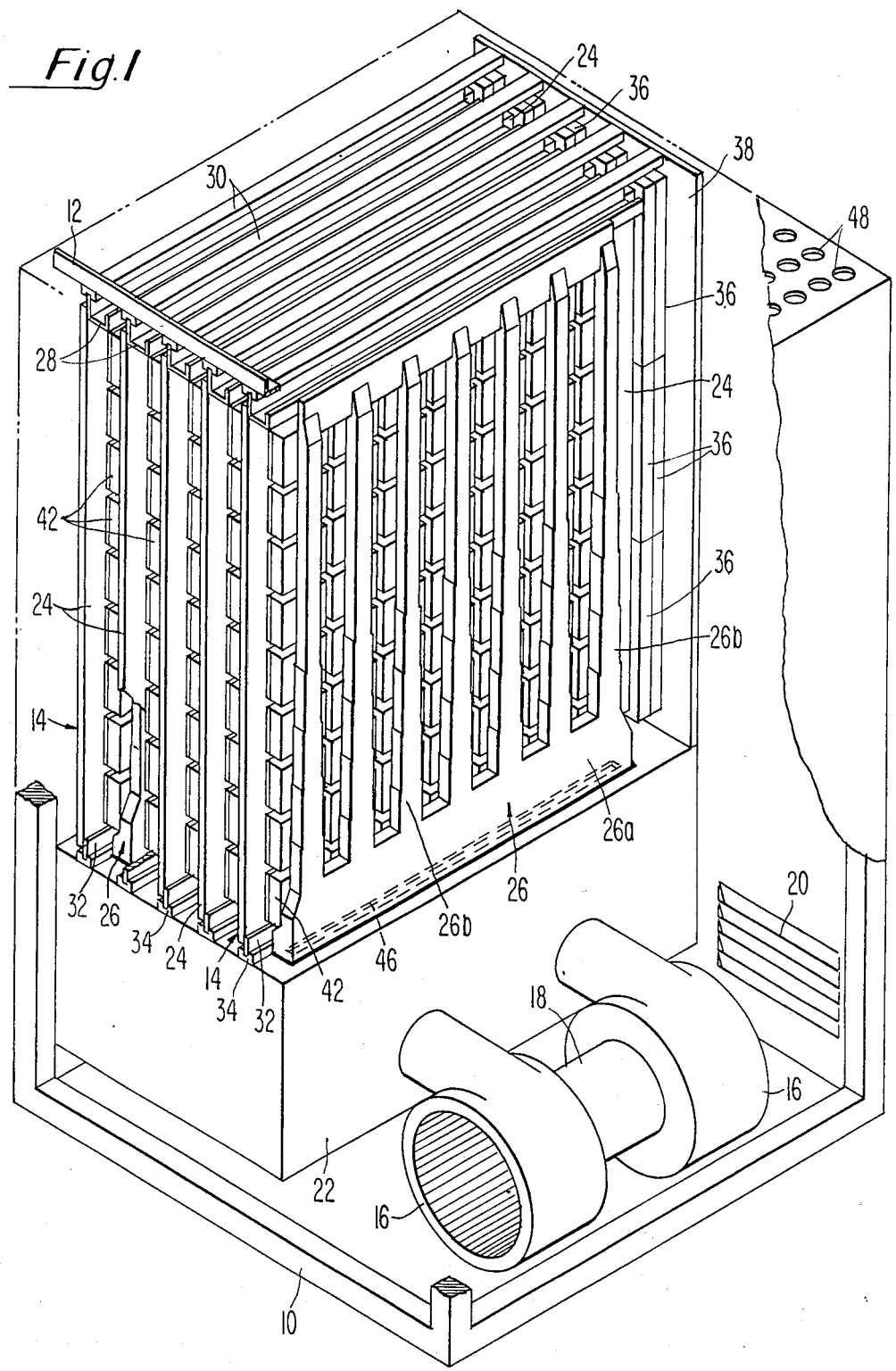

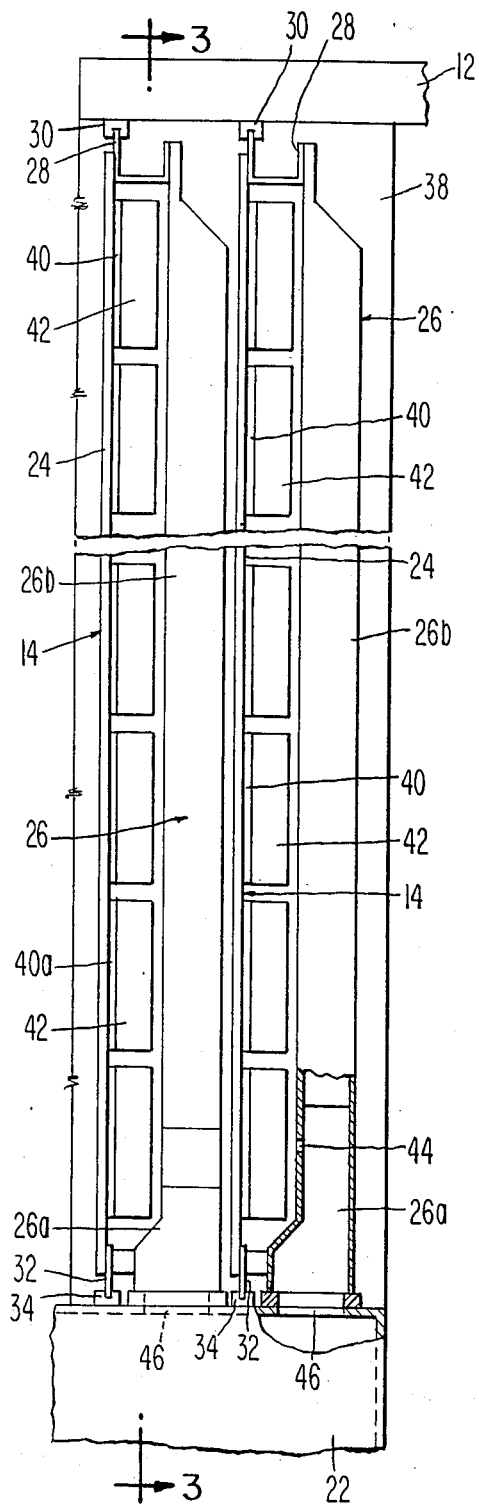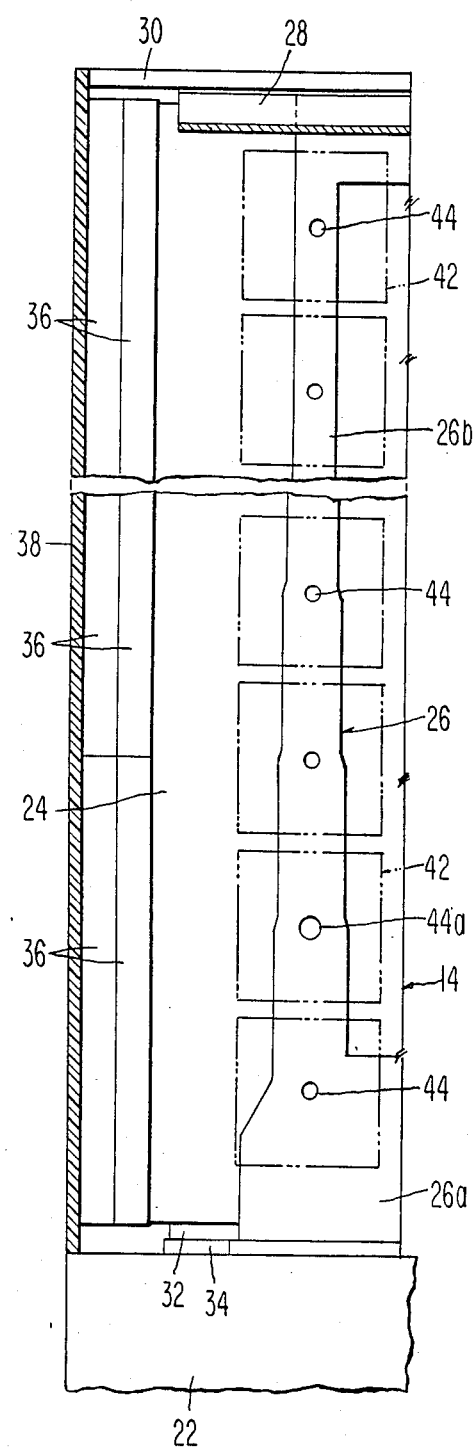

4,674,004

PARALLEL-FLOW AIR SYSTEM FOR COOLING ELECTRONIC EQUIPMENT

BACKGROUND OF THE INVENTION

Thermal design considerations for electronic equipment, such as a large scale computer system, involve primary concerns for performance, cost, reliability and low maintenance. In practice, performance requirements, on the one hand, are weighed against the remaining concerns, on the other. A system characterized by simplicity, but having the ability to provide adqate cooling of the electronic equipment, represents the best solution to the thermal problem. Air cooling is generally regarded as the most simple and reliable system. However, as the power density on the computer cards continually increases, it becomes increasingly more difficult to cool with air.

In the typical forced air cooling scheme, air is blown across the computer card in a direction parallel to the planar surface of the card. As the air travels across the card, it picks up heat in serial fashion, from the integrated circuit packages mounted thereon and the air increases in temperature. With the rise in card power levels, large volumes of air are needed to keep the air temperature rise from exceeding acceptable levels.

The cooling problem is further exacerbated by the increase in power and size of the integrated circuit packages. The high power levels of the last mentioned devices result in higher than average local temperature rises. Each pocket of high temperature air is directed by the air stream onto the next package. Also, as the devices become physically larger, they tend to block the flow of cooling air from the downstream packages. Because of the last mentioned thermal effects, every package forms a downstream wake of high temperature, low velocity air. With the high density packaging of present day electronic equipment, it is apparent that the downstream packages will fall directly within this wake. Moreover, these thermal effects become more difficult to control in proportion to the increase in physical size and power dissipation of the integrated circuit packages. Ultimately, in new computer design applications, the package and card power levels may overwhelm the cooling reasonably expected to be provided by the above-described, serially directed air stream. In such a case, more exotic cooling systems, such as those employing a water approach may be considered, notwithstanding the increase in complexity and cost and decrease in reliability of such systems.

What is desired is a cooling system which utilizes air as the cooling medium, but which differs from the conventional approach in its ability to maintain acceptable temperature levels in present day high density electronic equipment. The parallel-flow air system of the present invention fills such a need.

SUMMARY OF THE INVENTION

In accordance with the present invention, there is provided an arrangement for directing cooling air simultaneously from individual outlets upon a respective plurality of integrated circuit packages. The latter packages generally utilize heat sink members disposed thereon to enhance the cooling effect.

The aforementioned arrangement comprises the integral assembly of a printed circuit board or card and a ducting structure arranged in parallel, spaced-apart relationship. More specifically, the card includes a plurality of integrated circuit packages, with heat sinks mounted thereon, and disposed in parallel, spaced-apart columns. The ducting structure includes a card plenum leading into a plurality of finger-like ducts arranged to coincide with the columns of integrated circuit packages. Each of the ducts has a plurality of outlets, that is, apertures formed therein—the apertures being homologously positioned with respect to the packages.

In an actual working environment, a cabinet is provided having a rack for holding the card-duct assemblies of the present invention. Blower scrolls located at the bottom of the cabinet provide a source of high velocity, large volume cooling air flow, which is delivered to a central cabinet plenum. The individual card plenums of the respective card-duct assemblies interface with the central plenum in an air-sealed manner. Thus, air from the blower scrolls travels into the finger-like ducts, exits the apertures thereof, and is directed upon the respective surfaces of the individual heat sink members.

In contrast to the conventional serial air cooling scheme mentioned hereinbefore, the present parallel system offers highly significant advantages, not the least of which is that a high power card can be cooled with air. Also, the present system insures that every integrated circuit package in the card rack will receive cooling air at the blower inlet air temperature, while the temperature difference between packages is minimized. The system also requires a much lower volumetric air flow per watt of power dissipated, and the average device temperature is lower than that which can be achieved with a serial air system.

An important feature of the present invention is that each of the cards is provided with its own cooling system as an integral part of its assembly. Each card-duct assembly is compact in form, such that a large number of such assemblies may be mounted in close-packed relation to each other within the cabinet. Installation and removal of a card-duct assembly from a card rack is readily accomplished without disturbing the remaining assemblies. Other features and advantages of the present invention will become apparent from the detailed description thereof which follows.

BRIEF DESCRIPTION OF THE DRAWINGS

FIG. 1 is a pictorial illustration of the parallel air cooling system of the present invention.

FIG. 2 is a partial side view of the card-duct assemblies of the system of FIG. 1.

FIG. 3 is a section view taken along lines 3—3 of FIG. 2 illustrating the surface of the ducts having air outlets disposed adjacent the integrated circuit packages.

DETAILED DESCRIPTION OF THE PREFERRED EMBODIMENT

Figure 4:
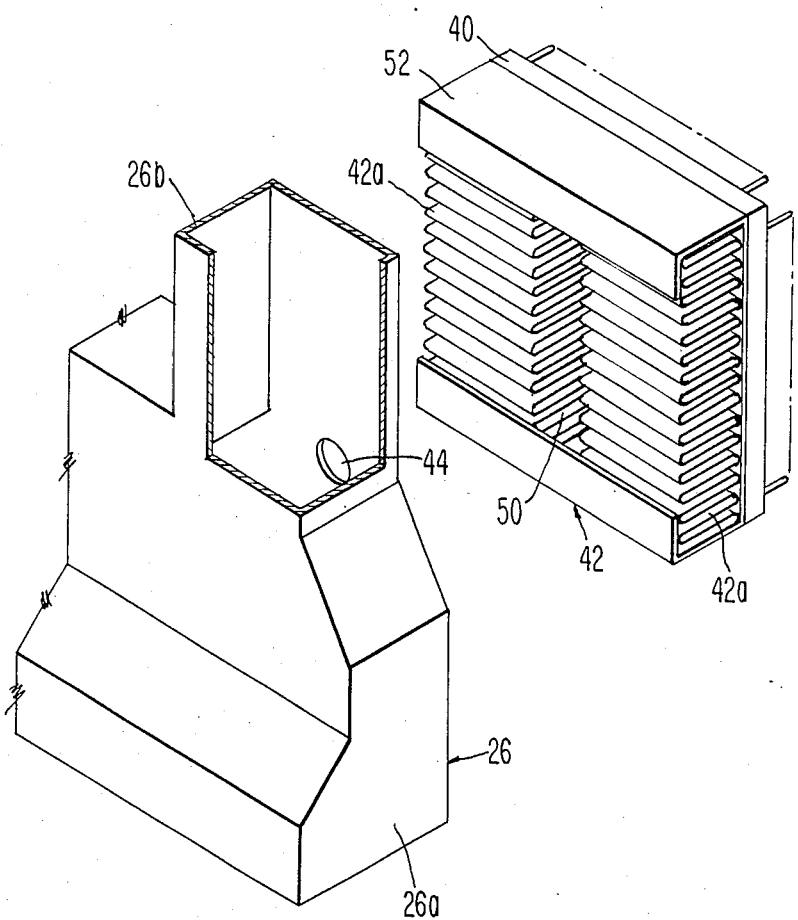
FIG. 4 is an exploded view depicting an integrated circuit package with its attendant heat sink member.

FIG. 1 depicts an actual working environment for the parallel cooling system of the present invention. A cabinet 10 is shown with its exterior walls partially cut away to illustrate a card rack 12 containing a plurality of card-duct assemblies 14. A pair of blower scrolls 16, driven by a motor 18, and located at the bottom of cabinet 10, draw surrounding air into the cabinet through louvers 20. Thus, a large volume, fast moving air stream is delivered by the scrolls to a central plenum 22.

With continued general reference to FIG. 1 and more specific reference to FIGS. 2 and 3, each of the card-duct assemblies 14 mounted in card rack 12 is comprised of a printed circuit board or card 24 rigidly fastened to a ducting structure 26 having a card plenum 26a and a plurality of finger-like ducts 26b opening thereinto. Each card 24 and its associated ducting structure 26 are held in proximate, parallel, spaced-apart relation by substantially U-shaped members 28, as seen particularly in FIG. 2. Moreover, one leg of each of the members 28 is elongated to engage the groove in each of the rack support channels 30. Each card-duct assembly 14 further includes a projection 32 for engaging the groove in each of the channels 34 mounted on the exterior surface of the central plenum 22. Electrical connections for each card result from the mating of connectors 36 mounted respectively on the card-duct assemblies 14 and the cabinet backplane 38.

As seen particularly in FIGS. 1 and 2, each of the cards 24 has mounted thereon a plurality of integrated circuit packages 40 with respective heat sink members 42 affixed thereto. The packages 40 are arranged generally in columns which coincide with the placement of the adjacent finger-like ducts 26b. As seen in FIG. 3, each of the latter ducts has a plurality of apertures 44 formed therein—the apertures 44 being homologously disposed with respect to the heat sink members 42.

In operation, the scrolls 16 (FIG. 1) deliver cooling air to the central plenum 22. From the latter, air is pushed into the openings of card plenums 26a via slots 46 in the central plenum 22. As the air traverses each of the finger-like ducts 26b, individual air streams are directed via apertures 44 (FIG. 3) over the respective heat sink members 42 of the integrated circuit packages 40. The heated air then exits the cabinet 10 via openings 48 in the upper portion thereof.

As is customary, heat sink members 42 are used to better dissipate the heat generated in the packages 40. In general, the form and configuration of heat sinks vary appreciably. While the present invention is not to be considered limited to the heat sinks 42 depicted in FIG. 4, the structure of the latter lends itself to the present system. Thus, each of the heat sink members 42 includes a pair of metallic corrugated sections 42a separated by an opening 50 and supported within a frame 52. Cooling air exiting an aperture 44 in a finger-like duct 26b tends to enter the opening 50 in the heat sink 42 and is then carried in opposite directions by sections 42a across the heat sink, where it exits the latter.

As to the design of the finger-like ducts 26b, reference to FIG. 1 reveals that the cross section of the duct is stepped, rather than constant. That is, the cross section of duct 26b is a maximum at its extremity adjacent the card plenum 26a and decreases in steps to the approximate midpoint of the duct. The duct 26b has a minimum cross section from the latter point to its opposite extremity. The reason for the stepped finger-like duct is that this configuration yields the highest total air flow rate at the lowest plenum pressure and with the least variability from one aperture 44 to another along the duct. Conversely, a constant cross section duct requires a high plenum pressure and exhibits considerable variability in individual air flow. For example, low flow rates issue from apertures 44 near the card plenum 26a of uniform cross section ducts—such low flow rates providing inadequate cooling for the integrated circuit packages 40 associated therewith. In summary, the stepped cross section duct 26b is preferred in the present system because it is superior to the constant cross section in maintaining a uniform differential pressure across all of the apertures 44.

Another significant feature of the present invention is that the individual volumes of cooling air provided by apertures 44 may be chosen in accordance with the power dissipations of the respective integrated circuit packages 40. Thus, as seen in FIGS. 2 and 3, it is assumed that package 40a is of a higher power type than the other packages. Accordingly, aperture 44a is larger to provide the volume of air needed to cool the chip housed in package 40a to substantially the same temperature as the chips in the other packages.

In conclusion, there has been described an effective air cooling system for high density electronic packaging applications. It is apparent that depending upon particular circumstances, changes and modifications of the system as described herein may be required. Such changes and modifications, insofar as they are not departures from the true scope of the invention, are intended to be covered by the claims which follow.

What is claimed is:

1. A parallel-flow air system disposed in a cabinet having a source of cooling air comprising:
    at least one integral card-duct assembly including a printed circuit card and an associated ducting structure, means for retaining said card and said ducting structure in fixed, parallel, spaced-apart relationship,
    said card having a plurality of integrated circuit package assemblies mounted thereon in a predetermined spaced-apart columnar relationship, said ducting structure including a plurality of finger-like ducts disposed in spatial correspondence with the columnar arrangement of said package assemblies, each of said ducts having a plurality of apertures homologously positioned with respect to said package assemblies, and
    means including said source of cooling air for causing air flow into said ducts and out of said apertures, thereby directing individual streams of cooling air simultaneously upon the respective package assemblies.

2. A parallel-flow air system as defined in claim 1 wherein each of said integrated circuit package assemblies includes a heat sink member affixed to an integrated circuit package.

3. A parallel-flow air system as defined in claim 2 wherein said means for causing air flow into said ducts includes a central plenum for receiving cooling air from said source thereof, said central plenum having a slotted opening therein for each card-duct assembly, said ducting structure including a card plenum, said card plenum having respective openings into said ducts and a further opening into said central plenum via said slotted opening in the latter.

4. A parallel-flow air system as defined in claim 3 further characterized in that each of said finger-like ducts exhibits a stepped cross section, the cross section of the duct being maximum at its extremity contiguous with said card plenum, and minimum at its opposite extremity, whereby the rates of air flow at the respective apertures of the duct are substantially equal.

5. A parallel-flow air system as defined in claim 4 further including a rack, channel means disposed opposite each other respectively on said rack and the surface of said central plenum, said card-duct assembly including means for engaging said channel means, whereby said card-duct assembly may be slidably installed within said cabinet.

6. A parallel-flow air system as defined in claim 5 further including a backplate, at least one electrical connector installed on said backplane, said card having at least one electrical connector mounted thereon for engagement with said electrical connector on said backplane when said card-duct assembly is slidably installed within said cabinet 7. A parallel-flow air system as defined in claim 6 wherein said heat sink member is comprised of a frame, a pair of metallic corrugated sections mounted in said frame in spaced-apart fashion such that an opening is formed therebetween, each of said streams of cooling air emanating from said apertures being directed substantially toward the last mentioned opening in said heat sink member.

8. A parallel-flow air system as defined in claim 7 further characterized in that said means for retaining said card and said ducting structure in fixed, parallel, spaced-apart relationship is a U-shaped member, said latter member having an elongated leg for engaging said channel means on said rack, said card-duct assembly having a projection for engaging said channel means on the surface of said central plenum.

9. A parallel-flow air system as defined in claim 8 wherein the cross section of each of said ducts is a maximum at its extremity contiguous with said card plenum and decreases in steps to the approximate midpoint of the duct and is a minimum from the last mentioned point to its opposite extremity.

10. A parallel-flow air system as defined in claim 9 wherein the stepped cross section of the finger-like duct is rectangular.

11. A parallel-flow air system as defined in claim 1 wherein said source of cooling air includes fan means for delivering air at a low pressure to said ducts.

12. A parallel-flow air system as defined in claim 1 further characterized in that each of said finger-like ducts exhibits a stepped cross section, the cross section of the duct being maximun at its extremity contiguous with said source of cooling air, and minimum at its opposite extremity, whereby the rate of air flow at the respective apertures of the duct are substantially equal.

13. A parallel-flow air system as defined in claim 11 wherein the stepped cross section of the finger-like duct is rectangular.

14. A parallel-flow air system disposed in a cabinet, having a source of cooling air comprising:
at least one integral card-duct assembly, including a printed circuit card and an associated ducting structure, means for retaining said card and said ducting structure in fixed, parallel spaced-apart relationship,
said card having a plurality of integrated circuit package assemblies mounted thereon in a predetermined spaced-apart columnar relationship, said ducting structure including a plurality of finger-like ducts disposed in spatial correspondence with the columnar arrangement of said package assemblies, each of said ducts having a plurality of apertures homologously positioned with respect to said package assemblies,
means including said source of cooling air for causing air flow into said ducts and out of said apertures, thereby directing individual streams of cooling air simultaneously upon the respective package assemblies, and
wherein each of said integrated circuit package assemblies includes a heat sink member affixed to an integrated circuit package, said heat sink member comprised of a frame, a pair of metallic corrugated sections mounted in said frame in spaced-apart fashion such that an opening is formed therebetween, each of said streams of cooling air emanating from said apertures being directed substantially toward the last mentioned opening in said heat sink member.

15. A parallel-flow air system as defined in claim 13 wherein said means for causing air flow into said ducts includes a central plenum for receiving cooling air from said source thereof, said central plenum having a slotted opening therein for each card-duct assembly, said ducting structure including a card plenum, said card plenum having respective openings into said ducts and a further opening into said central plenum via said slotted opening in the latter.

16. A parallel-flow air system as defined in claim 14 further characterized in that each of said finger-like ducts exhibits a stepped cross section, the cross section of the duct being maximum at its extremity contigous with said card plenum, and minimum at its opposite extremity, whereby the rates of air flow at the respective apertures of the duct are substantially equal.

17. A parallel-flow air system as defined in claim 14 further including a rack, channel means disposed opposite each other respectively on said rack and the surface of said central plenum, said card-duct assembly including means for engaging said channel means, whereby said card-duct assembly may be slidably installed within said cabinet.

18. A parallel-flow air system as defined in claim 16 further including a backplane, at least one electrical connector installed on said backplane, said card having at least one electrical connector mounted thereon for engagement with said electrical connector on said backplane when said card-duct assembly is slidably installed within said cabinet.

19. A parallel-flow air system as defined in claim 16 further characterized in that said means for retaining said card and said ducting structure in fixed, parallel, spaced-apart relationship is a U-shaped member, said latter member having an elongated leg for engaging said channel means on said rack, said card-duct assembly having a projection for engaging said channel means on the surface of said central plenum.

20. A parallel-flow air system as defined in claim 14 wherein the cross section of each of said ducts is a maximum at its extremity contiguous with said card plenum and decreases in steps to the approximate midpoint of the duct and is a minimum from the last mentioned point to its opposite extremity.

21. A parallel-flow air system as defined in claim 19 wherein the stepped cross section of the finger-like duct is rectangular.

* * * * *